April 28, 1970 F. J. ZGEBURA 3,509,382

FOUR ELECTRODE THYRISTOR CIRCUIT EMPLOYING SERIES RC NETWORK BETWEEN ANODE-GATE ELECTRODE AND CATHODE ELECTRODE

Filed Oct. 4, 1967 2 Sheets-Sheet 1

INVENTOR
F. J. ZGEBURA
BY Walter M. Hill
ATTORNEY

United States Patent Office 3,509,382

Patented Apr. 28, 1970

3,509,382

FOUR ELECTRODE THYRISTOR CIRCUIT EMPLOYING SERIES RC NETWORK BETWEEN ANODE-GATE ELECTRODE AND CATHODE ELECTRODE

Frank J. Zgebura, Whippany, N.J., assignor to Bell Telephone Laboratories, Incorporated, Murray Hill, N.Y., a corporation of New York Filed Oct. 4, 1967, Ser. No. 672,899

Int. Cl. H03k 17/72

U.S. Cl. 307—305 6 Claims

ABSTRACT OF THE DISCLOSURE

A circuit which improves the dynamic breakdown characteristic of an unenergized thyristor switch by connecting a capacitor and a resistor in series between the cathode and anode gate terminals of a four-terminal thyristor switch. While the thyristor switch is open, the direct voltage supply charges both the capacitor and the inherent middle junction capacitance of the thyristor to essentially the supply voltage. Should any transient condition cause a momentary change in voltage across the thyristor, no appreciable middle junction displacement current flows to cause false closing of the thyristor switch. After the switch has been closed and is in the process of reopening the capacitor rapidly recharges the middle junction capacitance to both aid in the recovery of the thyristor as well as to quickly restore its dynamic breakdown capability.

BACKGROUND OF THE INVENTION

This invention relates to semiconductor switching circuits and more particularly to a circuit means for improving the dynamic breakdown characteristic of such circuits.

Thyristors are becoming increasingly more important as high speed switches and pulse modulators in pulse communication systems. This is due not only to their inherent fast switching speeds but to the fact that circuits can be devised to increase their operating speeds considerably beyond their inherent capabilities. Pulse communication systems can rarely tolerate false signals so that an open or unenergized thyristor switch must not falsely close due to spurious switching transients or sudden supply voltage changes, regardless of their cause. This capability of a thyristor switch to resist these transients is variously called its dynamic breakdown capability, its rate effect capability or its *dv/dt* capability. The mechanism causing a false closing is generally found to be a momentary rapid rise in voltage across the thyristor anode and cathode terminals, thereby causing a forward displacement current to flow through the inherent middle junction capacitance to provide a false trigger current between the gate and cathode terminals. This phenomenon is more fully discussed in an article entitled "How To Suppress Rate Effect In PNPN Devices" by R. A. Stasior, appearing on pages 30–33 of the Jan. 10, 1964 issue of Electronics.

A finite time is required for the recovery of these switches once they have been closed and have conducted current. This is commonly called the forward blocking recovery time. To operate successfully, these switches must not only rapidly recover their forward blocking state but they must also be resistant to dynamic breakdown, i.e., they must have a good dynamic breakdown or *dv/dt* capability. Other methods of meeting these capabilities are disclosed in the copending application of W. B. Harris, R. P. Massey and F. J. Zgebura, Ser. No. 537,544 now U.S. Pat. 3,404,293 filed Mar. 25, 1966; in the copending application of D. V. Brockway, Ser. No. 549,030 now U.S. Pat. 3,444,398 filed May 10, 1966; and in the copending application of L. E. Cameron, W. B. Harris, R. P. Massey and F. J. Zgebura, Ser. No. 625,227 filed Mar. 22, 1967; all of which applications are assigned to the same assignee as the present application. These copending applications disclose inventions which involve the use of fast and slow recovery diodes connected in various ways to the thyristor terminals, thereby steering recovery currents through the several junctions of the thyristor, the dynamic breakdown capability during the recovery period generally being made by connecting a slow recovery diode between the gate and cathode junctions. However, these slow recovery diodes are effective only during the recovery period of the thyristor switch and provide no protection for an unenergized thyristor switch. The present invention employs a different concept for improving the dynamic breakdown capability especially adaptable to applications where the switch has been standing open or unenergized in a circuit connected to a source of power.

SUMMARY OF THE INVENTION

The invention comprises a circuit means to improve the rate effect capability of a thyristor switch circuit in which a series circuit of a capacitor and a resistor is connected between the anode gate terminal and the cathode terminal of the thyristor. The time constant is such that the capacitor will retain substantially all of its charge during a period measured by the sum of the time that the switch is closed and its recovery time so that, promptly after recovery, the middle junction capacitance of the thyristor is quickly recharged to essentially the source voltage by current flowing from the capacitor through the resistor and the cathode-gate junction. This recharging current is made too small to retrigger the thyristor but the charged middle junction materially reduces the *dv/dt* sensitivity of the device.

BRIEF DESCRIPTION OF THE DRAWINGS

The invention may be better understood by referring to the accompanying drawings in which.

DETAILED DESCRIPTION

Figure 1:
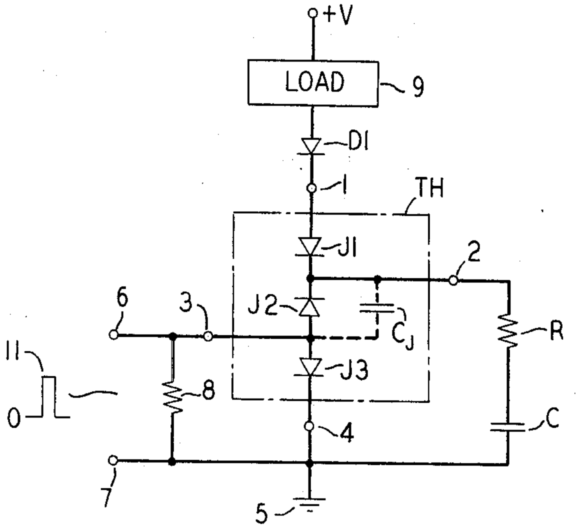
FIG. 1 shows a circuit disclosing the essential features of the invention.

FIG. 1 discloses a PNPN thyristor TH represented as an equivalent series circuit of three diodes having junctions J1, J2 and J3 between its four layers. The anode terminal 1 is connected to the first layer while the fourth layer is connected to the cathode terminal 4. The gate terminal 3 is connected to the third layer between the diodes representing junctions J2 and J3 while the anode gate terminal 2 is connected to the second layer between the diodes represented by junctions J1 and J2. The inherent middle junction capacitance $C_J$ is shown connected between anode gate terminal 2 and gate terminal 3. This represents the inherent capacitance of junction J2 between the second and third layers. An additional diode D1 may be connected in series with anode terminal 1 to improve the reverse blocking voltage rating of the switch and is particularly useful if the forward and reverse ratings are unequal. A load 9 is shown connected between the positive source of power and the anode terminal 1 so that as the switch is closed current is caused to flow through load 9. A trigger voltage having a positive-going waveform 11 is impressed across input terminals 6 and 7 to initiate current flow through the switch. As is well known, once current is started through the switch it will continue to flow until the switch is opened by some turn-off mechanism. A resistor 8 is connected between terminals 6 and 7 and consequently between the gate terminal 3 and cathode terminal 4. This resistor improves somewhat the rate effect capability of the switch although there is a practical limit to how low this resistance may be made. The operation of such a circuit is well known in the art and need not be described in detail. However, the mechanism which causes false operation of the switch may be briefly reviewed in order to explain the operation of the present invention.

Let it be assumed that capacitor C and resistor R are not in the circuit and that thyristor switch TH is open, i.e., unenergized. It will be found that the switch may be caused to falsely close if the supply voltage should momentarily increase. This quite frequently occurs when the supply voltage slowly lowers and then suddenly returns to its original nominal value. This sudden increase in voltage causes a displacement current to flow through the middle junction capacitance $C_J$ by way of the forward directions of diode D1, junction J1 and junction J3. As was previously stated, a pulse of current between input terminals 6 and 7 causes a momentary current to flow in the forward direction through junction J3, thereby causing the switch to close. For the same reason, a momentary displacement current through capacitance $C_J$ and flowing through junction J3 will also cause the switch to close. This is obviously undesirable and causes the circuit to become unreliable. It is evident that the circuit could be made more reliable if, by some means, the inherent junction capacitance $C_J$ could be rapidly recharged at a current rate below that which will permit the switch to close. When capacitance $C_J$ is charged to substantially the line voltage, the displacement current causing false operation of the switch cannot flow.

In accordance with the present invention, the middle junction capacitance $C_J$ is caused to be rapidly recharged after the switch has reopened by means of a capacitor C serially connected with resistor R between the anode gate terminal 2 and the cathode terminal 4. Applicant has discovered that if the time constant of capacitor C and resistor R is made large compared with the sum of the forward blocking recovery time and the time during which the switch had been closed, the charge on capacitor C will be only slightly depleted during switch closure and that if the capacitance of capacitor C is made large compared with the capacitance $C_J$, capacitor C can quickly recharge capacitance $C_J$ to substantially the supply voltage immediately after the switch reopens.

The switch in FIG. 1 may be opened by applying a current pulse to the input terminals 6 and 7 of a polarity opposite that shown at 11. An incidental benefit, not related to the rate effect capability of the switch, results from the presence of capacitor C in the circuit. While the switch is in the process of opening, part of the load current is diverted through the capacitor, leaving less current to be interrupted in the switch. As the switch opens, the voltage at the anode and anode gate quickly rises, thereby causing a division of the load current between the switch and the capacitor. Other types of turn-off circuits may be employed for opening the switch and the more common one is the resonant turn-off circuit shown in FIGS. 2 and 4.

Figure 2:
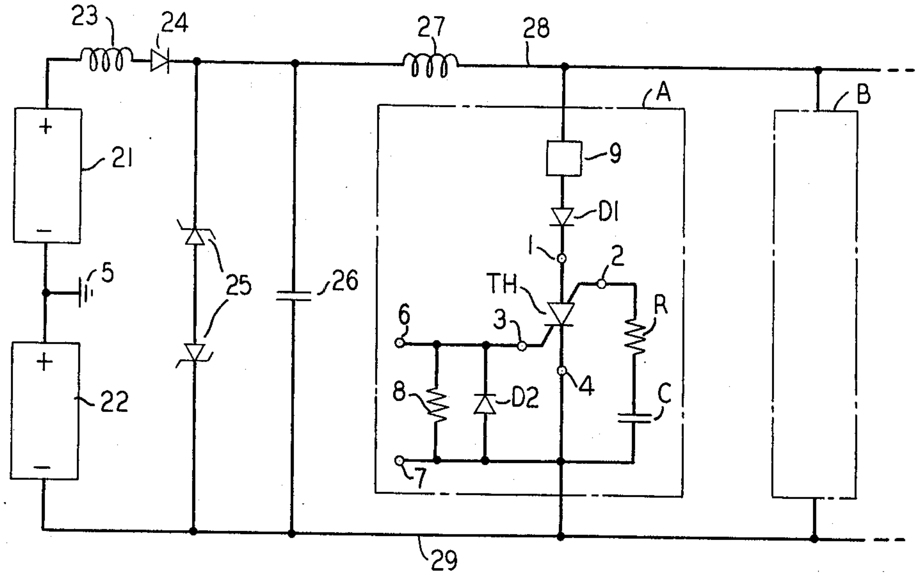
FIG. 2 discloses a plurality of circuits of the type shown in FIG. 1 connected in parallel across a single source of power.

FIG. 2 shows a plurality of switch circuits such as shown in FIG. 1 connected in parallel to a common source of power. Only two such circuits, A and B, are shown but additional circuits may be connected in the same manner. As in FIG. 1, circuit A comprises the load 9 connected in series with the diode D1 and the anode and cathode terminals 1 and 4, respectively, of the thyristor TH. In this figure, the thyristor is represented by a conventional symbol for such devices. The middle junction recharging circuit comprising capacitor C and resistor R is shown connected between the anode gate terminal 2 and the cathode terminal 4 in the same manner shown in FIG. 1. An additional diode D2 is connected between the gate terminal 3 and the cathode terminal 4 to protect the cathode-gate junction of the thyristor against excessive reverse voltages. It will be understood that the additional switch circuits, such as circuit B, contain the same type of circuitry shown for the switch circuit A. Power is supplied to the several parallel-connected circuits by way of conductors 28 and 29 which, in turn, are supplied with power from direct voltage sources 21 and 22. Sources 21 and 22 are connected in series, with the negative terminal of source 22 connected to conductor 29 while the positive terminal of source 21 is connected to conductor 28 by way of inductor 23, diode 24 and inductor 27. A capacitor 26 is connected between conductor 29 and the junction between the inductor 27 and diode 24. A pair of Zener diodes 25 are connected back to back in parallel with capacitor 26. The junction between power sources 21 and 22 may be connected to ground 5 as shown.

The operation of FIG. 2 may be explained by considering first that capacitor 26 has been charged from sources 21 and 22. Capacitor 26, in cooperation with inductor 23 and diode 24, constitutes a resonant charging circuit of a conventional type. As is well known, such circuits will cause capacitor 26 to be charged to a voltage approximately twice that provided by the series-connected sources 21 and 22. A trigger voltage applied between terminals 6 and 7 of any one of the thyristor switches will cause their associated switch to close and complete a circuit path from capacitor 26 through inductor 27, conductor 28, load 9, diode D1, the thyristor switch TH and back to the capacitor by way of conductor 29. Inductor 27 is provided with an inductance small compared with that of inductor 23. The result is that inductor 27 and capacitor 26 cooperate as a resonant turn-off circuit for the thyristor switch that has just been closed. The operation of such turn-off circuits is well known but will be very briefly reviewed. When the switch closes, the first half cycle of a ringing current flows in the forward direction through diode D1 and the thyristor switch. When this ringing current reverses in phase, it operates to automatically reopen the thyristor switch. This second half cycle of ringing current may restore some charge to capacitor 26 but when the switch reopens the flow of resonant current immediately ceases. The resonant charging circuit comprising inductor 23, diode 24 and capacitor 26 now operates in its usual manner to restore the charge to capacitor 26. The Zener diodes 25 operate to limit the voltages across the capacitor 26.

Figure 3:
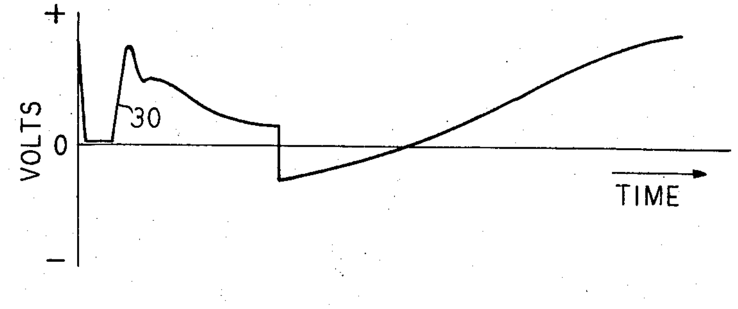
FIG. 3 illustrates a typical waveform representing the voltage between the anode and cathode terminals of each of the unenergized switches when one of the switches shown in FIG. 2 has been operated, and FIG. 4 discloses a string of switches connected in series with a single load and also embodying the features of this invention.

The voltage waveform shown in FIG. 3 refers to the voltage across the anode and cathode terminals 1 and 4 in the circuit of FIG. 2. The waveform begins at the instant one of the thyristor switches has been closed and represents the voltage appearing across the anode and cathode terminals of all of the remaining unenergized thyristor switches. When one of the thyristor switches has been closed, the voltage across all of the remaining thyristor switches rapidly drops to the vicinity of zero volts. A short time later, this voltage begins to rise again as indicated by the portion 30 in FIG. 3. The remainder of the waveform is of no significance insofar as the present invention is concerned except to point out that the steepest voltage rise will be found in the portion 30 of the waveform. It is this rapid voltage rise with time that would provide the current through the middle junction capacitance $C_J$ of the unenergized thyristors in the absence of the capacitor and resistor C and R, respectively, of this invention. If the rate of voltage rise, i.e., the *dv/dt*, exceeds the critical limit of the inherent rate effect capability of the unenergized thyristors, these thyristors will close falsely. As was previously explained, if these inherent middle junction capacitances $C_J$ of the unenergized thyristors are quickly recharged, but at a rate less than that which will cause the switch to close, they can be made practically incapable of false operation.

Figure 4:
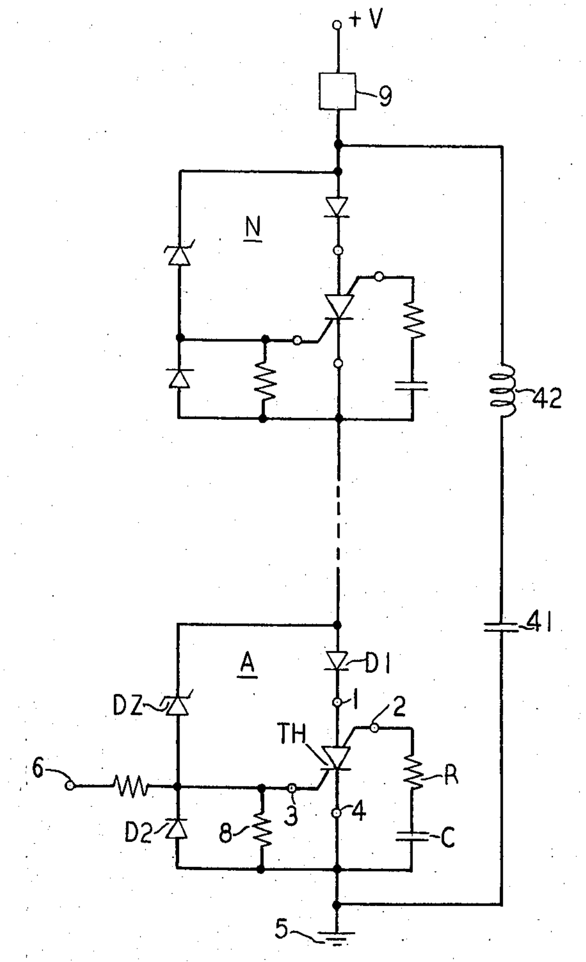

The circuit of FIG. 4 discloses a plurality of switch circuits A through N connected in a series string. Each of these switch circuits, for example circuit A, may contain, in addition to the circuit elements previously described, a Zener diode DZ, the purpose of which is to facilitate closing all of the switches in the string promptly after one switch has been closed. The operation of this circuit is substantially the same as that described in the above-mentioned copending application of D. V. Brockway. As explained in that application, it is preferred that diode D2 have an inherent reverse recovery time longer than that of the middle junction of its associated thyristor TH while the reverse recovery time of the Zener diode DZ should be less than that of the middle junction of the thyristor. When a trigger pulse is applied to terminal 6, the thyristor switch in circuit A is caused to close which immediately starts a current flow through all of the Zener diodes and the gate to cathode junctions of the remaining thyristor circuits, thereby forcing all of them to immediately close. The switches are then all caused to reopen through the action of the conventional resonant turn-off circuit comprising inductor 42 and capacitor 41. The details of the switching operation and the recovery of these thyristors is fully explained in the copending Brockway application and it is unnecessary to review this sequence in order to understand the operation of the present invention. It will be noted that each of the thyristor switch circuits in FIG. 4 has a capacitor C and a resistor R connected between its anode gate terminal 2 and its cathode terminal 4. The operation of this series-connected resistor and capacitor is the same in this circuit as was described for FIGS. 1 and 2.

It will be readily apparent that the advantages of this invention may be realized by the simple connection of a capacitor C and resistor R between the anode gate and cathode terminals and that this capacitor will act to promptly recharge the middle junction capacitance of the thyristor to prevent false operation of an unenergized thyristor switch. It may also be mentioned that this recharging action assists in the recovery of the middle junction since current supplied from this capacitor flows in the reverse direction through the middle junction during the recovery period.

What is claimed is:

1. A circuit means for improving the unenergized dynamic breakdown characteristic of a thyristor switch having four layers with an anode terminal connected to the first layer, an anode gate terminal connected to the second layer, a gate terminal connected to the third layer and a cathode terminal connected to the fourth layer, said circuit means comprising a series circuit of a capacitor and a resistor connected between said cathode and anode gate terminals.

2. The combination of claim 1 wherein said thyristor switch has an inherent internal capacitance between its second and third layers and the capacitance of said capacitor is large compared with said inherent internal capacitance.

3. The combination of claim 1 wherein the time constant of said series circuit is large compared to the sum of the forward blocking recovery time of said thyristor switch and the time said thyristor switch is closed.

4. A thyristor switch circuit comprising a thyristor having an anode terminal, an anode gate terminal, a gate terminal and means for coupling signals between a plurality of said terminals to alternately close and open the circuit path between said anode terminal and said cathode terminal, and a capacitor and a resistor connected in series between said cathode terminal and said anode gate terminal.

5. The combination of claim 4 wherein an internal capacitance exists in said thyristor between said gate and anode gate terminals and the capacitance of said capacitor is large compared to said inherent internal capacitance.

6. The combination of claim 4 wherein the time constant of said capacitor and resistor is large compared with the sum of the forward blocking recovery time of said thyristor and the time said circuit path between said anode and cathode terminals is closed.

References Cited

UNITED STATES PATENTS

| | | | |
|---|---|---|---|
| 3,254,236 | 5/1966 | Meng | 307—252 |
| 3,278,827 | 10/1966 | Corey et al. | 307—252 X |
| 3,281,677 | 10/1966 | Baggott | 307—252 X |
| 3,287,576 | 11/1966 | Motto | 307—252 |

JOHN S. HEYMAN, Primary Examiner

U.S. Cl. X.R.

307—252, 284